United States Patent [19]

Yamamoto et al.

[11] Patent Number: 4,791,649

[45] Date of Patent: Dec. 13, 1988

[54] SEMICONDUCTOR LASER DEVICE

[75] Inventors: Saburo Yamamoto; Taiji Morimoto; Noboyuki Miyauchi; Shigeki Maei, all of Nara, Japan

[73] Assignee: Sharp Kabushiki Kaisha, Osaka, Japan

[21] Appl. No.: 885,952

[22] Filed: Jul. 15, 1986

[30] Foreign Application Priority Data

Jul. 17, 1985 [JP] Japan .................... 60-158576

[51] Int. Cl.$^4$ .............................................. H01S 3/19
[52] U.S. Cl. ........................................ 372/48; 372/45; 372/46
[58] Field of Search .................... 372/48, 46, 45

[56] References Cited

U.S. PATENT DOCUMENTS

| | | | |
|---|---|---|---|
| 4,545,057 | 10/1985 | Hayakawa et al. | 372/48 |
| 4,546,481 | 10/1985 | Yamamoto et al. | 372/48 |
| 4,677,633 | 6/1987 | Yamamoto et al. | 372/48 |
| 4,679,200 | 7/1987 | Matsui et al. | 372/48 |
| 4,686,679 | 8/1987 | Yano et al. | 372/48 |
| 4,730,328 | 3/1988 | Miyauchi et al. | 372/48 |

FOREIGN PATENT DOCUMENTS

| | | |
|---|---|---|
| DEA2422287 | 11/1975 | Fed. Rep. of Germany . |
| 0005587 | 1/1985 | Japan ............ 372/46 |

OTHER PUBLICATIONS

N. K. Dutta "Calculated Threshold Current of GaAs Quantum Well Lasers" Bell Laboratories, Murray Hill, New Jersey 07974, J. Appl. Phys. 53(11), Nov. 1982, 0021-8979/82/117211 1982, American Institute of Physics, pp. 7211-7214.

W. T. Tsang "Extremely Low Threshold (AlGA) As Modified Multiquantum Well Heterostructure Lasers Grown by Molecular-Beam Epitaxy". Appl. Phys. Lett. 39(10), Nov. 15, 1981, 0003-6951/81/220786 1981, American Inst. of Physics, pp. 786-788.

Electronics Letters, Mar. 3rd, 1983, vol. 19, No. 5 "Dynamic Behaviour of a GaAs-AlGaAs MQW Laser Diode" and Bulk Unipolar Diodes in ME GaAs, pp. 180-181.

Fujitsu K. K. et al., (Oct. 24, 1981) Patent Abstracts of Japan 5 (167), JP 56-96890.

Nippon Denki K.K. et al., (Jun. 29, 1983) Patent Abstracts of Japan 7 (148), JP 58-58783.

Nippon Denki K.K. et al., (Oct. 27, 1984) Patent Abstracts of Japan 8 (235), JP 59-117287.

Nippon Denki K.K. et al., (Aug. 6, 1985) Patent Abstracts of Japan 9 (189), JP 60-057988.

Nippon Denki K.K. et al., (May 2, 1981) Patent Abstracts of Japan 5(6), JP 56-17093.

Primary Examiner—William L. Sikes
Assistant Examiner—Xuan T. Vo
Attorney, Agent, or Firm—Ciotti & Murashige, Irell & Manella

[57] ABSTRACT

A multilayered crystal structure in a semiconductor laser device contains an active layer for laser oscillation on a V-stripe channeled substrate having a current-blocking layer thereon. The active layer further includes regions by means of which carriers within the active layer are prevented from diffusing outside of the active layer. These regions are disposed facing each other with an optical waveguide therebetween which is formed by the absorption of light by the portions of the current-blocking layer which are positioned at both sides of the striped channel. The distance between the regions is narrower than the width of the optical waveguide in the vicinity of both facets and wider than the width of the optical waveguide inside of both facets.

2 Claims, 1 Drawing Sheet

SEMICONDUCTOR LASER DEVICE

BACKGROUND OF THE INVENTION

1. Field of the invention:

This invention relates to an index guided semiconductor laser device which attains laser oscillation at an extremely low threshold current level without creating astigmatism.

2. Description of the prior art:

Conventional semiconductor laser devices are classified into two groups, gain-guided semiconductor laser devices and index guided semiconductor laser devices, according to their optical waveguiding mechanism. Index guided semiconductor laser devices are superior to gain-guided semiconductor laser devices in view of transverse mode stabilization which is important in practical use. Index guided semiconductor laser devices having a variety of structures have been proposed, typical examples of which are BH (buried heterostructure) lasers and VSIS (V-channeled substrate inner stripe) lasers.

FIG. 2(A) shows a BH laser device, in which a multi-layered crystal structure having the width W is formed into a stripe on the p-GaAs substrate 1 so as to function as a laser oscillation operating area. The multi-layered crystal structure constitutes a double-heterostructure which is composed of a p-GaAlAs cladding layer 2, a GaAlAs active layer 3, an n-GaAlAs cladding layer 4, and an n-GaAs cap layer 5. A substance 15 having a low refractive index is buried outside of the active layer 3, resulting in an index guided structure creating no astigmatism and having a threshold current of as small as about 10 mA. However, if a proper refractive index is not applied to the burying layer 15 and if a proper width is not applied to the waveguide, the device will oscillate in a high-order transverse mode. Thus, the BH laser device is disadvantageous in that it is restricted by production conditions.

FIG. 2(B) shows a VSIS laser device, which is produced as follows: On a p-GaAs substrate 1, an n-GaAs current blocking layer 6 is formed by liquid phase epitaxy. Then, a striped V-channel having the width W is formed in the substrate 1 through the current blocking layer 6, resulting in a current path. Then, on the current blocking layer 6 including the V-channel, a p-GaAlAs cladding layer 2, a GaAlAs active layer 3, an n-GaAlAs cladding layer 4, and an n-GaAs cap layer 5 are successively formed by liquid phase epitaxy, resulting in a double-heterostructure for laser oscillation operation. Even when the width W of the waveguide is set at a value of as large as 4-7 μm, since laser light outside of the waveguide within the active layer 3 is absorbed by the substrate 1, highorder mode gain is suppressed and a high-order transverse mode does not occur. However, the threshold current of this VSIS laser device is 40-60 mA, which is extremely higher than that of the BH laser device. Moreover, the astigmatism arising from this VSIS laser device is as large as 10-20 μm.

The reason why the threshold current of the VSIS laser device becomes high is as follows: Current injected into the device is confined within the inner striped structure formed by the current blocking layer 6, but carrier injected into the active layer 3 diffuses into the outside of the active layer 3, resulting in carrier unusable for laser oscillation. FIG. 3 shows the distribution of carrier density n in the junction direction y within the active layer of the VSIS laser device, indicating that when the waveguide width W is 4 μm, carrier at the shaded areas (corresponding to the outside of the waveguide) is unusable for laser oscillation. The unusable carrier results in unnecessary light and/or generating unnecessary heat, causing a decrease in reliability of the device. Moreover, the above-mentioned large astigmatism of the VSIS laser device arises because light outside of the waveguide is absorbed by the substrate and the wave front of said outside light is propagated later than that of light inside of the waveguide.

SUMMARY OF THE INVENTION

The semiconductor laser device of this invention, which overcomes teh above-discussed and numerous other disadvantages and deficiencies of the prior art, comprises a multi-layered crystal structure containing an active layer for laser oscillation on a V-stripe channeled substrate, whreein regions by means of which carrier within said active layer is prevented from diffusing outside of said active layer are disposed facing each other with an optical waveguide therebetween which is formed by the absorption of light by the shoulder portions of the striped channel, the distance between said regions being narrower than the width of said optical waveguide in the vicinity of both facets and wider than the width of said optical waveguide inside of both facets.

The regions for preventing carrier from diffusing outside of said active layer are, in a preferred embodiment, composed of burying layers having a greater energy gap than said active layer.

Thus, the invention described herein makes possible the objects of (1) providing a novel semiconductor laser device which oscillates at a low threshold current level; (2) providing a novel semiconductor laser device which does not create astigmatism; and (3) providing a novel semiconductor laser device which does not create a high-order transverse mode.

BRIEF DESCRIPTION OF THE DRAWINGS

This invention may be better understood and its numerous objects and advantages will become apparent to those skilled in the art by reference to the accompanying drawings as follows.

DETAILED DESCRIPTION OF THE PREFERRED EMBODIMENTS

The VSIS semiconductor laser device of this invention contains regions by means of which carrier within the active layer is prevented from diffusing outside of the waveguide. The distance between said regions is narrower than the width of the V-channel in the vicinity of both facets of the device and wider than the width of the V-channel inside of both facets.

EXAMPLE

Figure 1A:
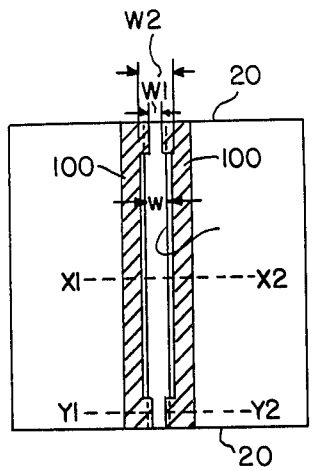
FIG. 1(A) is a plane view showing a semiconductor laser device of this invention.
Figure 1B:
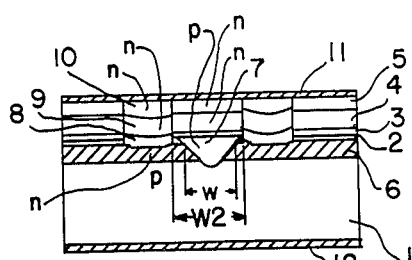
FIGS. 1(B) and 1(C), respectively, are front sectional views on lines $X_1$-$X_2$ and $Y_1$-$Y_2$ showing the semiconductor laser device shown in FIG. 1(A).
Figure 1C:
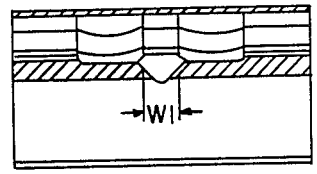

FIGS. 1(A), 1(B) and 1(C) show a semiconductor laser device of this invention, which comprises a p-GaAs substrate 1, an n-GaAs current blocking layer 6, a p-GaAlAs cladding layer 2, a GaAlAs active layer 3, an n-GaAlAs cladding layer 4, and an n-GaAs cap layer 5 in that order. This device has a V-striped channel 7 having the width W in the center of the substrate 1 in such a manner that the channel 7 reaches the substrate 1 through the current blocking layer 6. Buried regions 100 indicated by the shaded areas are disposed facing each other with the V-striped channel 7 therebetween. The distance therebetween is $W_1$ in the vicinity of both facets 20 of the device and $W_2$ inside of the facets 20, wherein $W_1 < W < W_2$. Each of the buried regions 100 is composed of a p-GaAlAs burying layer 8, an n-GaAlAs burying layer 9 and an n-GaAs burying layer 10, which are positioned in that order on the current blocking layer 6 outside of the V-channel 7. The AlAs mole fraction (i.e., x) in each of the $Ga_{1-x}Al_xAs$ burying layers 8 and 9 is larger than that of the active layer 3. Reference numerals 11 and 12 are an n-sided electrode and a p-sided electrode, respectively.

Figure 1D:
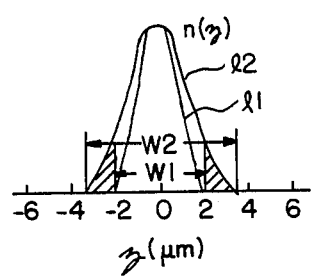
FIG. 1(D) is a graph showing the carrier density distribution of the semiconductor laser device of this invention.
Figure 2A:
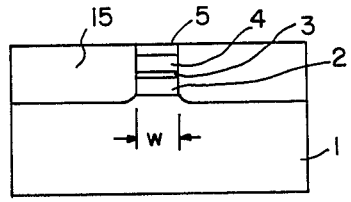
FIGS. 2(A) and 2(B), respectively, are front sectional views showing a conventional BH laser device and a conventional VSIS laser device.
Figure 2B:
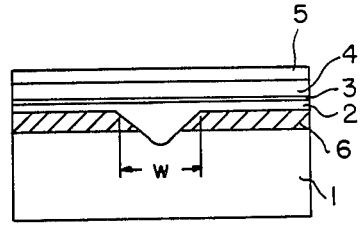
Figure 3:
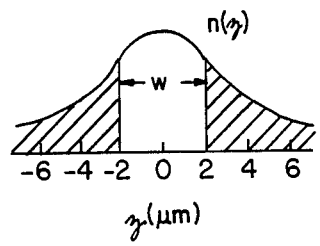
FIG. 3 is a graph showing the carrier density distribution of the conventional VSIS laser device shown in FIG. 2(B).

Light from the active layer 3 is absorbed by the current blocking layer 6, resulting in an index-optical waveguide within the active layer 3 according to VSIS laser operation theory, so that the width of the optical waveguide becomes equal to the width W of the V-striped channel 7. Carrier within the active layer 3 is prevented from diffusing by the burying layers 8 and 9, and the carrier density distributions shown in FIG. 1(D) are exhibited, wherein curve $l_1$ is the distribution in the vicinity of the facets and curve $l_2$ is the distribution inside of the facets, indicating that unusable carrier of said VSIS laser device of this invention shown by the shaded areas is remarkably smaller than that of the conventional VSIS laser device shown in FIG. 3, resulting in a remarkable decrease in the oscillation threshold current level.

As shown in FIG. 1(C), the VSIS laser device of this invention has the same index waveguide as a BH laser device, and accordingly, astigmatism does not occur. Moreover, as shown in FIG. 1(B), the optical waveguide is formed according to VSIS laser operation theory, and thus a high-order transverse mode does not occur. Therefore, this VSIS laser device is also advantageous in that the width $W_1$ of the waveguide in the vicinity of the facets 20 can be set at a wider value than that of a conventional BH laser device, and the optical density in the vicinity of the facets can be maintained at a low level.

The semiconductor laser device of this invention shown in FIGS. 1(A) to 1(C) can be produced using a GaAs/GaAlAs compound semiconductor, as follows: On the (100) face of a p-GaAs substrate 1, an n-GaAs current blocking layer 6 having a thickness of 0.8 μm is epitaxially grown. Then, a V-striped channel 7 having a depth of 1.2 μm and a width (W) of 5 μm is formed in the substrate through the current blocking layer 6 by photolithography and a chemical etching technique, resulting in a current path. Then, on the current blocking layer 6 including the V-channel 7, a p-$Ga_{0.7}Al_{0.3}As$ cladding layer 2, a p-$Ga_{0.95}Al_{0.05}As$ active layer 3, an n-$Ga_{0.7}Al_{0.3}As$ cladding layer 4, and an n-GaAs cap layer 5 are successively formed by liquid phase epitaxy, resulting in a double-heterostructure multi-layered crystal for laser oscillation. Then, grooves are formed on both sides of the V-channel 7 from the cap layer 5 to the current blocking layer 6, as indicated by the shaded parts shown in FIG. 1(A), by a reactive ion etching technique. The distance $W_1$ between the grooves in the vicinity of the facets 20 is 4 μm and the width $W_2$ therebetween inside of the facets 20 is 7 μm. Then, the grooves are filled with a p-$Ga_{0.8}Al_{0.2}As$ burying layer 8, an n-$Ga_{0.8}Al_{0.2}As$ burying layer 9, and an n-GaAs burying layer 10, which are successively formed by liquid phase epitaxy. Since the burying layers 8 and 9 have a greater energy gap than the active layer 3, they can prevent carrier from diffusing to theoutside thereof.

Then, the upper face of each of teh n-GaAs cap layer 5 and the n-GaAs burying layer 10 and the back face of the p-GaAs substrate 1 are subjected to a vapor deposition treatment with metal materials of Au-Ge and Au-Zn, respectively, and subjected to a heating treatment to form an n-sided electrode 11 of an alloy of Au-Ge and a p-sided electrode 12 of an alloy of Au-Zn, respectively followed by cleaving to form a Fabry-Pérot resonator having an internal cavity length of 250 μm. Then, the resonator is mounted on a copper plate by means of a soldering material such as In in such a manner that the face of the n-sided electrode 11 faces the copper plate, resulting in a semiconductor laser device unit of this invention.

The semiconductor laser device obtained above oscillated with a wavelength of 820 nm at a threshold current of as low as about 15 mA. The beam waist in the junction direction was in accord with that in the direction perpendicular to the junction direction and these beam waists were positioned at each of the facets, so that no astigmatism could be observed. The laser device attained continuous laser oscillation in a stabilized fundamental transverse mode at an optical output of 30 mW or more.

The semiconductor laser device of this invention is not limited to the GaAs/GaAlAs system, but is applicable to other heterostructure semiconductor materials such as the InP/InGaAsP system, etc. As a growth method for the growth of semiconductor layers, not only liquid phase epitaxy, but also metal organic-chemical vapor deposition (MO-CVD), vapor phase epitaxy (VPE), molecular beam epitaxy (MBE), etc., can be used.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device comprising a multi-layered crystal structure containing an active layer for laser oscillation on a V-stripe channeled substrate having a current blocking layer thereon, and regions by means of which carrier within said active layer is prevented from diffusing outside of said active layer disposed facing each other with an optical waveguide therebetween which is formed by the absorption of light by the portions of the current blocking layer which are positioned at both sides of the striped channel, the distance between said regions being narrower than the width of said optical waveguide in the vicinity of both facets and wider than the width of said optical waveguide inside of both facets.

2. A semiconductor laser device according to claim 1, wherein said regions for preventing carrier from diffusing outside of said active layer are composed of burying layers having a greater energy gap than said active layer.

* * * * *